United States Patent [19]

Bitting

[11] Patent Number: 5,016,014
[45] Date of Patent: May 14, 1991

[54] HIGH ACCURACY ANALOG-TO-DIGITAL CONVERTER WITH RAIL-TO-RAIL REFERENCE AND INPUT VOLTAGE RANGES

[75] Inventor: Ricky F. Bitting, Fort Collins, Colo.

[73] Assignee: NCR Corporation, Dayton, Ohio

[21] Appl. No.: 538,354

[22] Filed: Jun. 14, 1990

[51] Int. Cl.$^5$ .................. H03M 1/46; H03M 1/68
[52] U.S. Cl. .................. 341/162; 341/172; 341/165; 341/150; 341/145
[58] Field of Search ............ 341/172, 150, 155, 145, 341/165, 118, 156

[56] References Cited

U.S. PATENT DOCUMENTS

| | | | |
|---|---|---|---|
| Re. 32,313 | 12/1986 | Yamakido | 341/172 X |
| 4,366,439 | 12/1982 | Yamakido | 341/172 X |
| 4,369,433 | 1/1983 | Yamakido | 341/150 |
| 4,384,277 | 5/1983 | Allgood et al. | 341/150 |
| 4,385,286 | 5/1983 | Haque | 341/172 X |
| 4,388,612 | 6/1983 | Takagi et al. | 341/150 X |
| 4,907,002 | 3/1990 | Kawada | 341/172 |

OTHER PUBLICATIONS

"High-Resolution A/D Conversion in MOS/LSI" by B. Fotouhi, et al., IEEE J. Solid-State Circuits, vol. SC-11, No. 6, Dec. 1976, p. 136.
"A Precision Variable-Supply CMOS Comparator" by David J. Allstot, IEEE Journal of Solid-State Circuits, vol. SC-17, No. 6, Dec. 1982, p. 1082.
"A 10-Bit 5-Msample/s CMOS Two-Step Flash ADC" by J. Doernberg, et al., IEEE Journal of Solid-State Circuits, vol. 24, No. 2, Apr. 1989, p. 241.
"All-CMOS Charge Redistribution Analog-To-Digital Conversion Techniques-Part II" by R. Suarez, et al., IEEE J. Solid-State Circuits, vol. SC-10, pp. 379–385, Dec. 1975.

*Primary Examiner*—J. R. Scott
*Assistant Examiner*—Sharon D. Logan
*Attorney, Agent, or Firm*—Wilbert Hawk, Jr.; Stephen F. Jewett; James M. Stover

[57] ABSTRACT

An analog-to-digital inverter includes successive approximation control logic for generating ten-bit binary numbers, a digital-to-analog converter (DAC) having a resistor string and a weighted-capacitor array for converting the ten-bit binary output of the control logic to a known analog voltage, and an analog comparator for comparing the output of the DAC to a reference voltage provided via a tap to the mid-point of the DAC resistor string. The unknown analog voltage input to the ADC and the reference voltage are provided to the capacitor array to precharge the array to a voltage equal to the reference voltage minus the unknown analog voltage. The output of the DAC is therefore equal to the known analog voltage plus the reference voltage minus the unknown analog voltage.

14 Claims, 14 Drawing Sheets

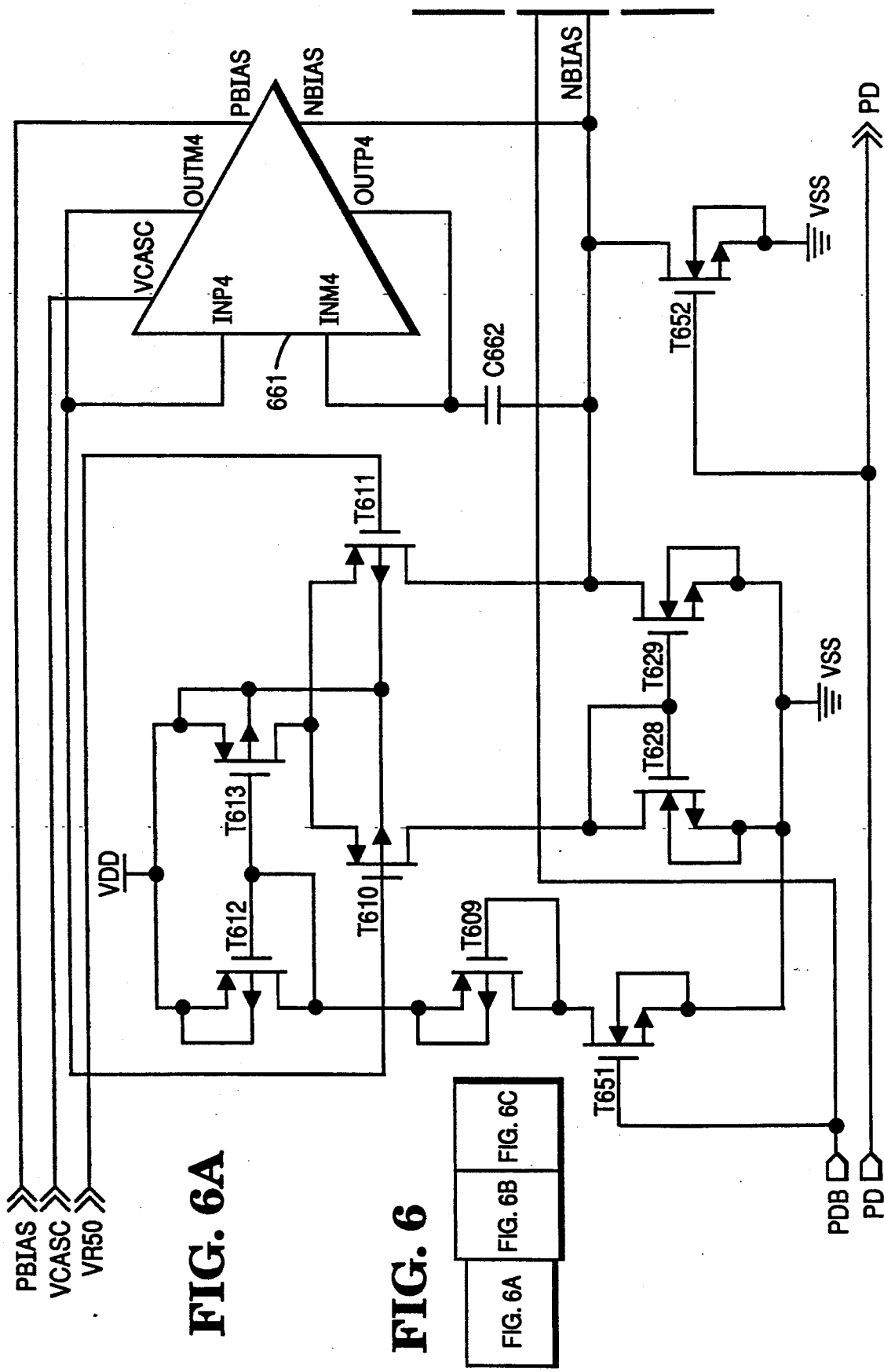

HIGH ACCURACY ANALOG-TO-DIGITAL CONVERTER WITH RAIL-TO-RAIL REFERENCE AND INPUT VOLTAGE RANGES

The present invention relates to analog-to-digital converters and, more particularly, to a successive approximation analog-to-digital converter including a resistor-string/capacitor-array digital-to-analog converter.

BACKGROUND OF THE INVENTION

Analog-to-digital converters are utilized in applications where it is required to convert an analog signal into a digital form for processing by a digital system. A schematic diagram of a prior art ten-bit successive-approximation analog-to-digital converter (ADC) is shown in FIGS. 1A and 1B. The ADC includes three main elements: a control logic circuit 101, a digital-to-analog converter (DAC) 103, and an analog comparator 105. DAC 103 includes a resistor string comprised of resistors R101 through R116 for converting a four-bit binary value to an analog value and a weighted-capacitor array comprising capacitors C101 through C107 for converting a six-bit binary value to an analog value. Switches S101 through S125 are controlled such that any ten-bit binary value can be converted into an analog value, the four most significant bits of the ten-bit binary value being converted by the resistor string and the remaining six bits being converted by the capacitor array.

The converter operation is as follows. With switch S118 open, switch S126 closed, switches S120 through S125 placed in position "2" and switch S119 placed in position "3" the bottom plates of capacitors C101 through C107 are connected to sample and hold the unknown analog voltage (VIN) to be converted. After opening switch S126, a successive-approximation search among the resistor string taps is conducted to find the voltage segment within which the stored unknown analog voltage lies. During this search the converter successively divides in half the voltage range in which the comparator has placed the unknown analog voltage. Then, with switches S101 through S119 set to connect the ends of the resistor which defines this segment to buses 118 and 119, the capacitor bottom plates are switched in a successive-approximation sequence until the voltage potential of the top plate of the capacitor array, i.e., the voltage level provided to comparator 105, is equal to ground potential.

The following example is provided to aid in the understanding of the operation of the converter. Assume that the VREF equals 16 volts and the unknown analog voltage VIN equals 7.8 volts. With VREF equal to 16 volts the voltage drop across each resistor R101 through R116 is 1 volt. Prior to initiation of the successive approximation search, capacitors C101 through C107 are charged to −7.8 volts (top plates relative to bottom plates) following the procedure set forth in the preceding paragraph.

The steps in the successive approximation search are as follows, each step taking one clock cycle. The search begins with switches S120 through S125 placed in their "3" positions, switch S108 closed and switch S119 set to position 2. Thus the voltage potential of the bottom plates of the capacitor array is set to 8 volts (the analog equivalent to binary value 1000000000), and the voltage potential of the top plates, which is provided to the minus input of comparator 105, is 0.2 volts. The comparator output indicates that VIN is less than 8 volts so during the next search step switch S108 is opened and switch S104 is closed providing a voltage potential of 4 volts to the capacitor bottom plates. The top plate voltage is now −3.8 volts. The comparator output indicates that VIN is greater than 4 volts. During the third search step switch S104 is open and switch S106 is closed providing 6 volts to the bottom plates of the capacitor array and −1.8 volts to the top plates. The fourth search step provides 7 volts to the bottom plates of the capacitors by closing switch S107 and setting switch S119 to position "1". The top plate voltage will be −0.8 volts. Thus, after four clock cycles it is determined that the unknown analog voltage VIN lies between 7 and 8 volts.

At the onset of the search among capacitors C101 through C107, switches S107 and S108 are closed, switches S118 and S119 are positioned to provide 7 volts to bus 119 and 8 volts to bus 118, switches S120 through S124 are set to their "2" positions and switch A125 is set to position "1". After redistribution of the charge among the capacitors, the potential of the top plate of the capacitors will be −0.3 volts. For the sixth search step switches S125 and S124 are set to their "1" position. The potential of the top plate of the capacitor array will equalize at −0.05 volts. A total of ten search steps will be conducted as shown in the table provided below. The voltages shown in steps 7 through 10 have been rounded off at the hundredths decimal place. At the conclusion of the search the binary equivalent of VIN will be determined to be 0111110011, the last value to produce a "yes" answer to the comparison.

TABLE 1

| Step | Comparison | Answer | Binary Value |
|---|---|---|---|
| 1 | 8.00 V-VIN <= OV | No | 1000000000 |
| 2 | 4.00 V-VIN <= OV | Yes | 0100000000 |
| 3 | 6.00 V-VIN <= OV | Yes | 0110000000 |
| 4 | 7.00 V-VIN <= OV | Yes | 0111000000 |
| 5 | 7.50 V-VIN <= OV | Yes | 0111100000 |
| 6 | 7.75 V-VIN <= OV | Yes | 0111110000 |
| 7 | 7.88 V-VIN <= OV | No | 0111111000 |
| 8 | 7.81 V-VIN <= OV | No | 0111100100 |
| 9 | 7.78 V-VIN <= OV | Yes | 0111100010 |
| 10 | 7.80 V-VIN <= OV | Yes | 0111110011 |

During the sample period the capacitor array is charged to −VIN (top plate voltage relative to bottom plate). The control logic begins the successive approximation sequence by setting the bottom plates of capacitors C101 through C107 at a voltage equal to VREF/2, the voltage at the midpoint of the resistor string. The voltage potential of the top plate of the capacitor array will therefore equal (VREF/2) −VIN during the onset of the successive approximation sequence. If the potential of VIN is between zero and VREF then the voltage swing on the top plate of the capacitor array is −VREF/2 to VREF/2. Thus, the voltage on the top plate of the capacitor array will be outside of voltage range defined by the supply rails for VREF between 0 and VDD causing parasitic diodes to turn on which will remove charge from the capacitor array.

A difficulty associated with prior art analog-to-digital converter architectures is that they generally have restricted references and/or input voltage ranges, frequently equal to one half of the supply span. To achieve higher voltage ranges, converter accuracy must be sacrificed.

The following articles, incorporated herein by reference, provide details on the construction and digital converters and components thereof. digital converts and components thereof.

(1) "All MOS Charge Redistribution Analog-to-Digital Conversion Techniques—Part I" by James McCreary and Paul Gray, IEEE Journal of Solid State Circuits, Volume SC-10, pp 371-379, December 1975.

(2) "High Resolution A/D Conversion in MOS/LSI" by Bahram Fotouhi and David A. Hodges, IEEE Journal of Solid State Circuits, Volume SC-11, (Number 6, December 1976.

(3) "A 10-bit 5-Msample/s CMOS Two-Step Flash ADC" by Joey Doernberg, Paul R. Gray and David A. Hodges, IEEE Journal of Solid State Circuits, Volume 24, Number 2, April 1989.

OBJECTS OF THE INVENTION

It is therefore an object of the present invention to provide a new and improved analog-to-digital converter not subject to the foregoing disadvantages.

It is another object of the present invention to provide such an analog-to-digital converter which accepts rail-to-rail input reference and input voltage ranges.

It is yet another object of the present invention to provide a new and improved digital-to-analog converter and analog comparator for an analog-to-digital converter.

It is another object of the present invention to provide such a analog-to-digital converter wherein voltages within the comparator are maintained within the supply rail voltage range.

It is still a further object of the present invention to provide such an analog comparator which includes means for auto-zeroing the DC voltage of said comparator to a voltage equal to one-half the sum of the comparator supply voltages.

SUMMARY OF THE INVENTION

There is provided, in accordance with the present invention, a method and apparatus for converting an unknown analog voltage known to reside within a range of voltages between a first and second voltage to a binary signal. The method includes the steps of generating a reference voltage equal to one-half the sum of said first and second voltages, generating a known analog voltage within the voltage range; subtracting the reference voltage from the unknown analog voltage; summing the known analog voltage with the output of the subtracting step; and comparing the output of the summing step with the reference voltage. If the difference between the output of the summing step and the reference voltage exceeds a predetermined value a new value for the known analog voltage is generated and the above steps are repeated.

In the described embodiment, the analog-to-digital converter (ADC) comprises a successive approximation control circuit for generating ten-bit binary signals, a digital-to-analog converter (DAC) connected to receive the binary signals from the control circuit and convert the binary information into a known analog voltage, and an analog comparator connected to receive the output of the DAC and a reference voltage.

The DAC includes a resistor string for converting the four most significant bits of the ten-bit signals and a capacitor array for converting the six least significant bits of the binary signals. A tap to the mid-point of the resistor string provides the reference voltage supplied to the comparator. The ADC also includes switch means under the control of the control circuit for providing the reference voltage and the unknown analog voltage to the capacitor array to charge the array to a voltage level equal to the reference voltage minus the unknown analog voltage. The output of the DAC is therefore equal to the known analog voltage plus the reference voltage minus the unknown analog voltage. The inputs to the comparator will be equal only when the unknown analog voltage is equal to the known analog voltage generated by the DAC in response the control logic.

The above objects and other objects, features, and advantages of the present invention will become apparent from the following detailed specification when read in conjunction with the accompanying drawings in which applicable reference numerals have been carried forward.

BRIEF DESCRIPTION OF THE DRAWINGS

FIGS. 6A through 6C are a schematic diagram of the comparator bias circuit shown in FIG. 4.

DETAILED DESCRIPTION OF THE PREFERRED EMBODIMENT

Figure 2A:
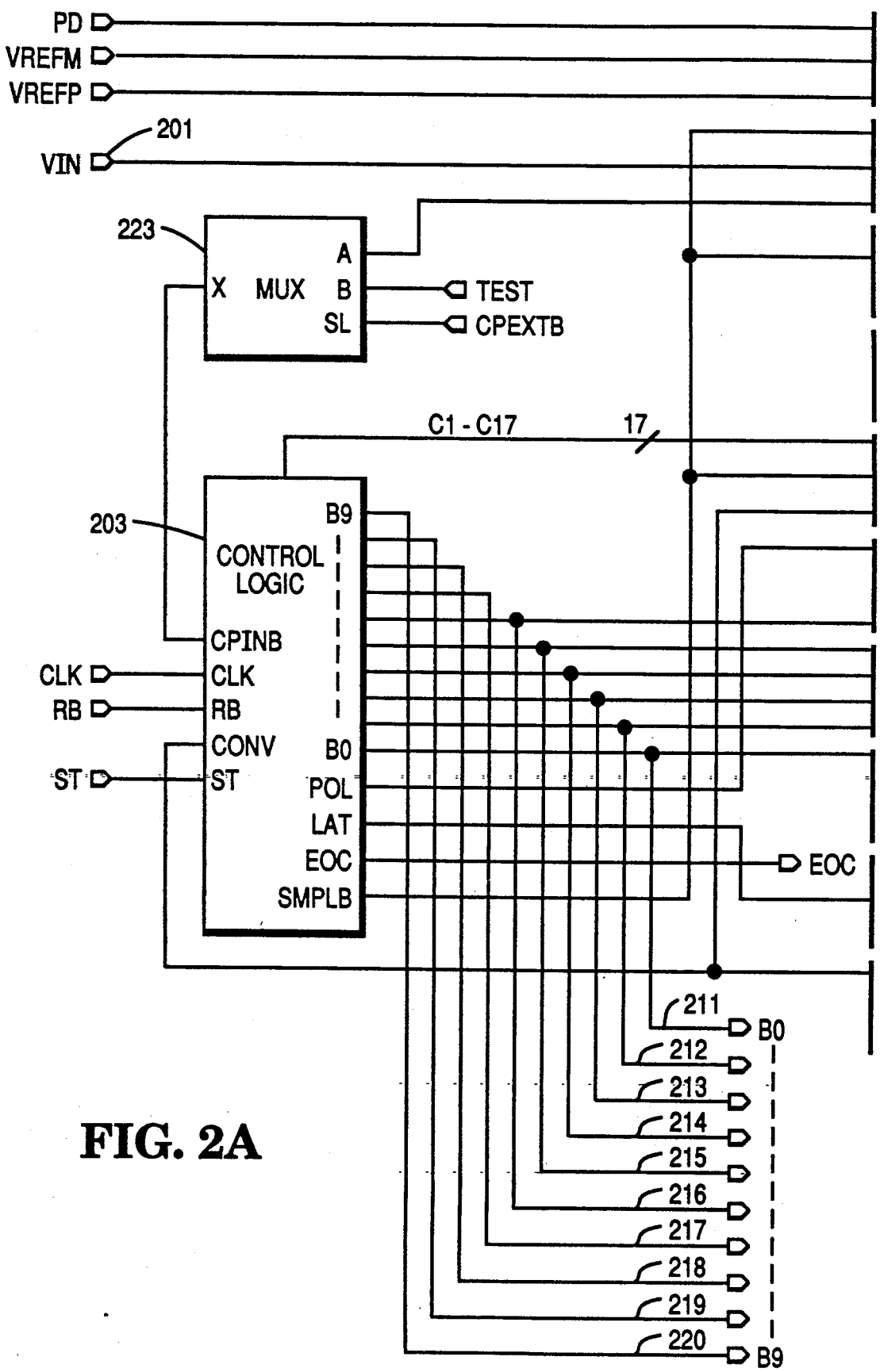
FIGS. 2A and 2B are a top view schematic diagram of an analog-to-digital converter constructed in accordance with the present invention.
Figure 2B:
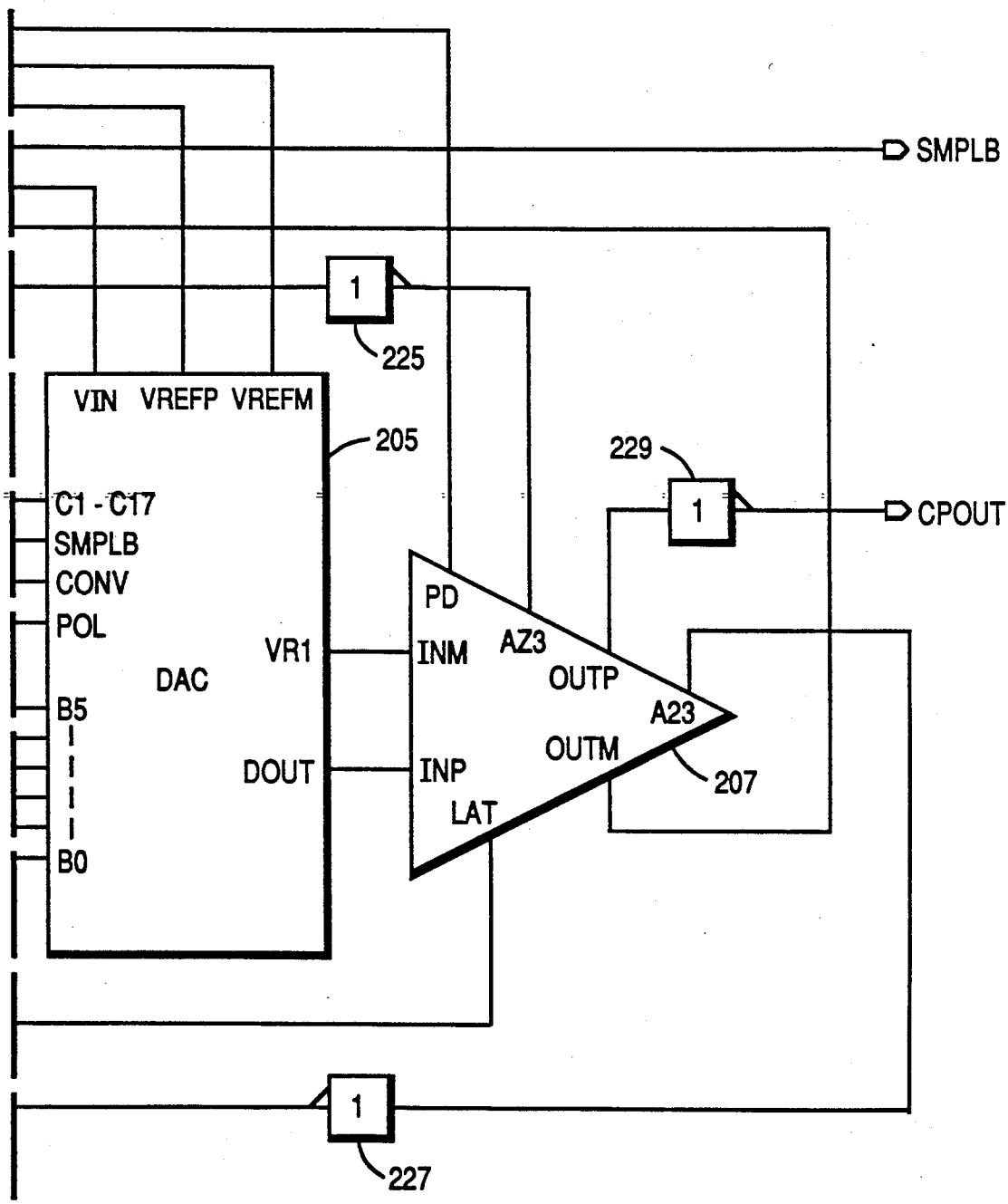

Referring now to FIGS. 2A and 2B, there is seen a top view schematic diagram of a ten-bit successive-approximation analog-to-digital converter constructed in accordance with the present invention. The ADC illustrated in FIG. 2 includes an input 201 for receiving an unknown analog signal VIN to be converted to a digital value, a control logic circuit 203, a digital-to-analog converter (DAC) 205, an analog comparator 207, and a set of output terminals 211 through 220 for providing the binary equivalent of input signal VIN. As will be explained in more detail below, DAC 205 and comparator 207 include improvements which distinguish the present invention from prior art analog-to-digital converters.

Control logic circuit 203 generates the ten-bit binary output, B0-B9, which is provided to ADC output terminals 211 through 220. Control logic circuit 203 also includes decoding logic for converting signals B9-B6, the four most significant bits of the binary output, into control signals C1-C17. Each one of the sixteen possible four-bit combinations of B9-B6 enables a different set of adjacent control signals as shown in table 2.

TABLE 2

| B9-B6 | Control Signals Set HIGH | B9-B6 | Control Signals Set HIGH |
|---|---|---|---|
| 0000 | C1, C2 | 1000 | C9, C10 |
| 0001 | C2, C3 | 1000 | C10, C11 |
| 0010 | C3, C4 | 1010 | C11, C12 |

TABLE 2-continued

| B9–B6 | Control Signals Set HIGH | B9–B6 | Control Signals Set HIGH |
|---|---|---|---|
| 0011 | C4, C5 | 1011 | C12, C13 |
| 0100 | C5, C6 | 1100 | C13, C14 |
| 0101 | C6, C7 | 1101 | C14, C15 |
| 0110 | C7, C8 | 1110 | C15, C16 |
| 0111 | C8, C9 | 1111 | C16, C17 |

DAC 205 is connected to receive binary output signals B0–B5, control signals C1–C17, and a sample signal SMPLB from circuit 203, reference voltages VREFM and VREFP from external voltage sources (not shown), and input analog signal VIN from input 201. The DAC provides two analog outputs, VR1 and DOUT, to the plus and minus inputs, INP and INM, respectively, of comparator 207. The comparator generates complementary outputs OUTP and OUTM, providing output OUTM through a multiplexer 223 to control logic circuit 203. Multiplexer 223 is provided for testing purposes. DAC 205 and comparator 207 will be discussed in greater detail below.

Figure 3A:
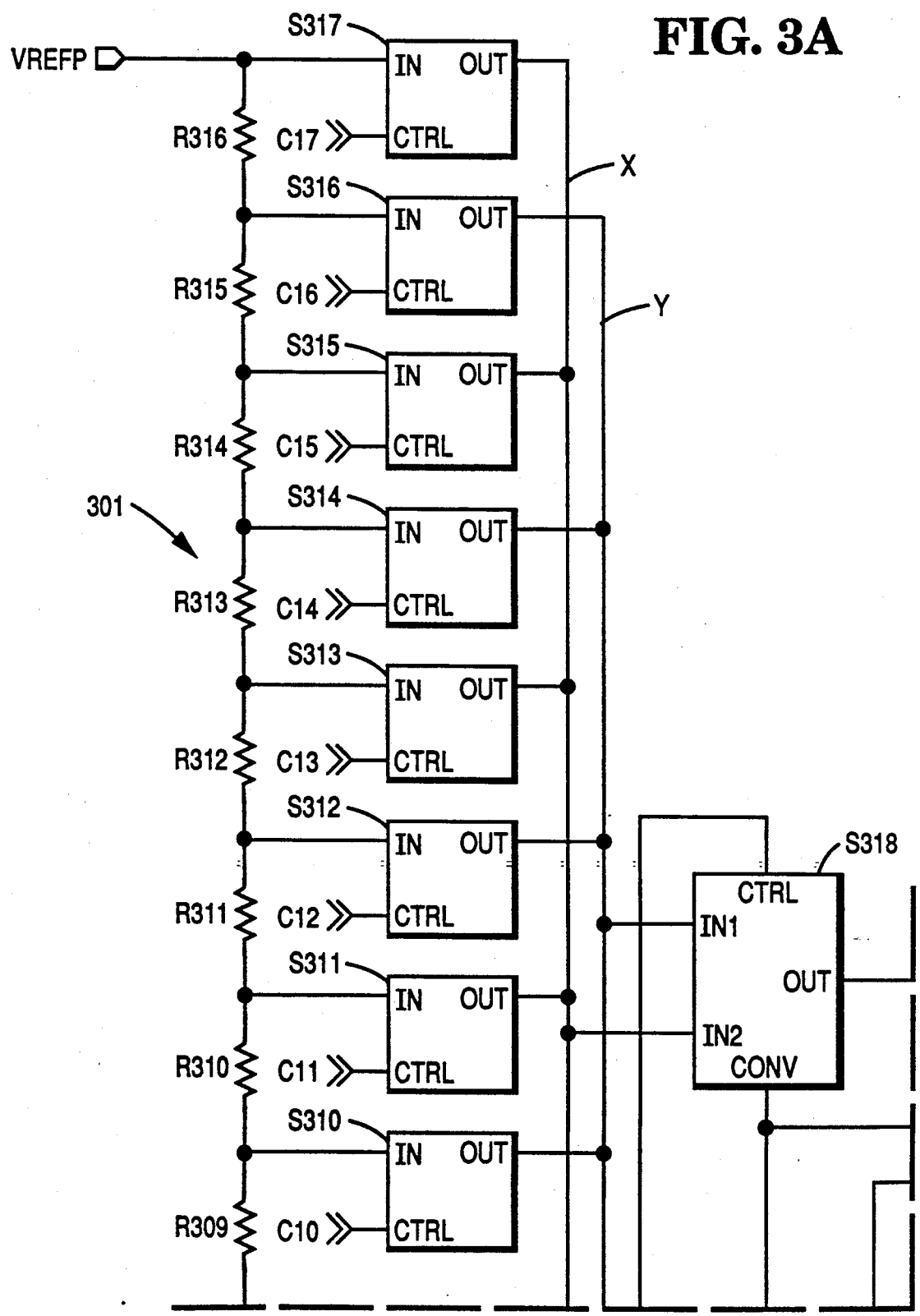
FIGS. 3A through 3C are a schematic diagram of the digital-to-analog converter shown in FIG. 2.
Figures 3, 3B:
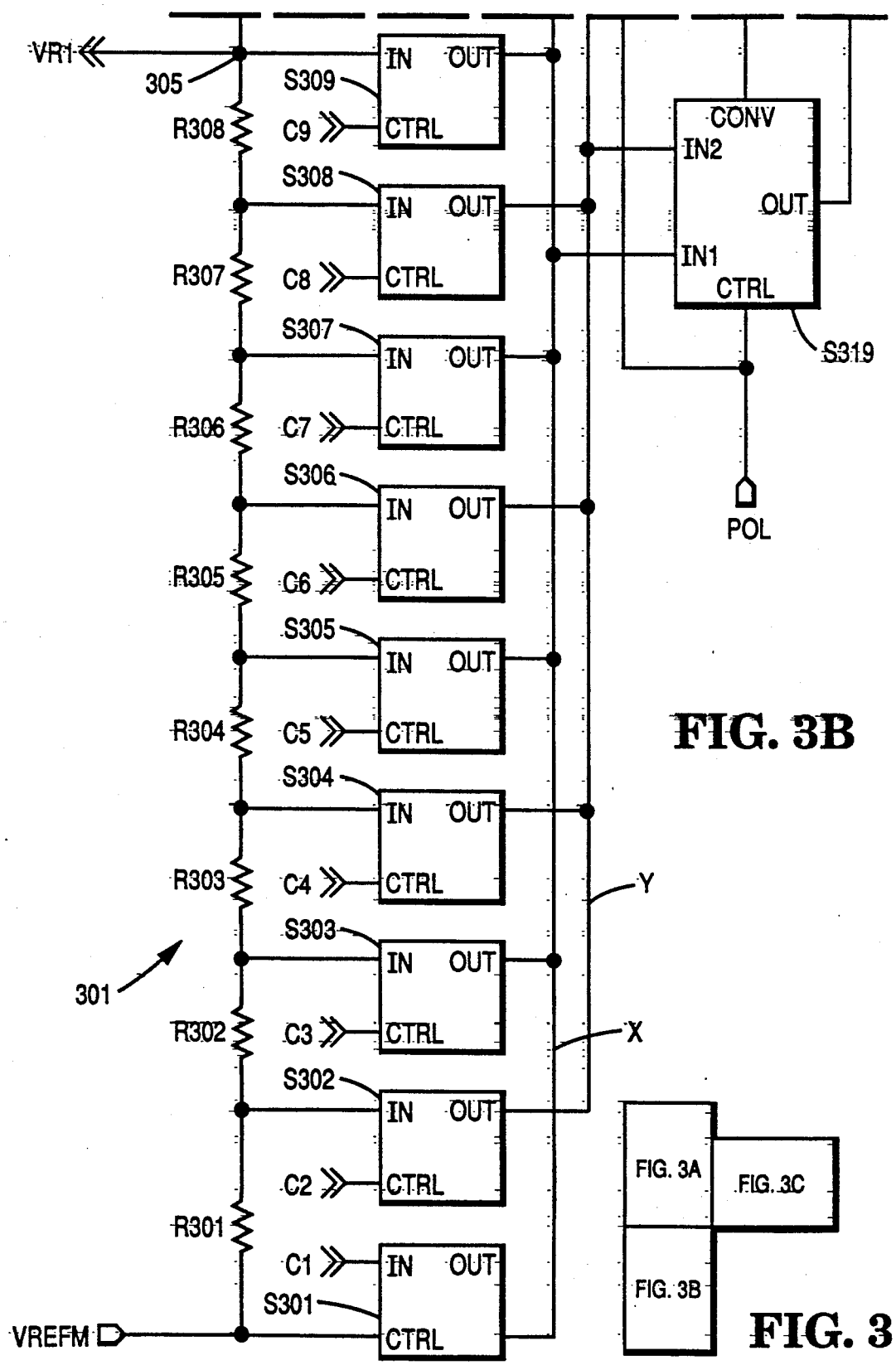
Figure 3C:
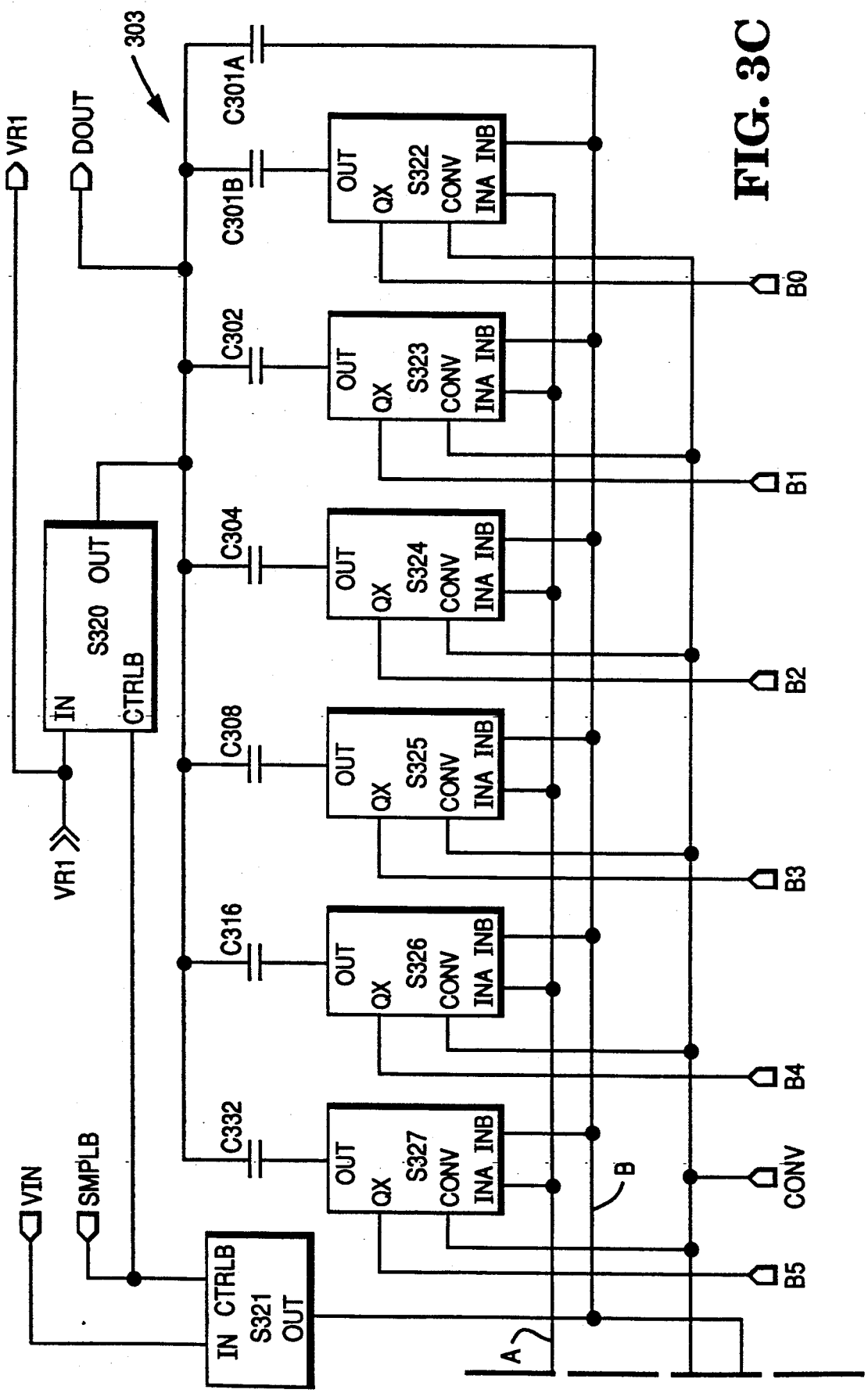

FIGS. 3A through 3C are a schematic diagram of DAC 205. DAC 205 includes a resistor-string 301 for converting the four most significant bits of digital data received from circuit 203, and a capacitor array 303 for converting the six least significant bits of digital data received from circuit 203.

Resistor string 301 includes sixteen resistors labeled R301 through R316 connected in series between reference voltage inputs VREFM and VREFP, each resistor having the same ohmic value, 750 ohms. Switches S301 through S317 connect reference voltage VREFM, the nodes between the resistors and reference voltage VREFP to one of two buses, labeled X and Y, the odd-numbered switches being connected to bus X and the even-numbered switches connected to bus Y. Switches S301 through S317 operate in response to control signals C1 through C17, respectively, provided by the control logic.

The capacitor array includes seven capacitors, labeled C301A, C301B, C302, C304, C308, C316 and C332. The capacitance of these resistors is shown to be 0.4 pf, 0.4 pf, 0.8 pf, 1.6 pf, 3.2 pf, 6.4 pf, and 12.8 pf, respectively. The top plates of all of these capacitors are connected to a common node, while the bottom plates of C301B, C302, C304, C308, C316 and C332 are connected to switches S322 through S327, respectively. Switches S322 through S327 permit connection of the bottom plates of their respective capacitors to either one of two buses, labeled A and B. The bottom plate of capacitor C301A is connected directly to bus B. Switches S322 through S327 are controlled by signals B1 through B6.

Between resistor string buses X and Y and capacitor array buses A and B are two switches S318 and S319. Switch S318 selectively couples one of buses X or Y to bus A and switch S319 connects one of buses X or Y to bus B. Control signal POL operates switches S318 and S319.

The construction of DAC 205 thus far described is well known by those skilled in the art.

Figure 1A:
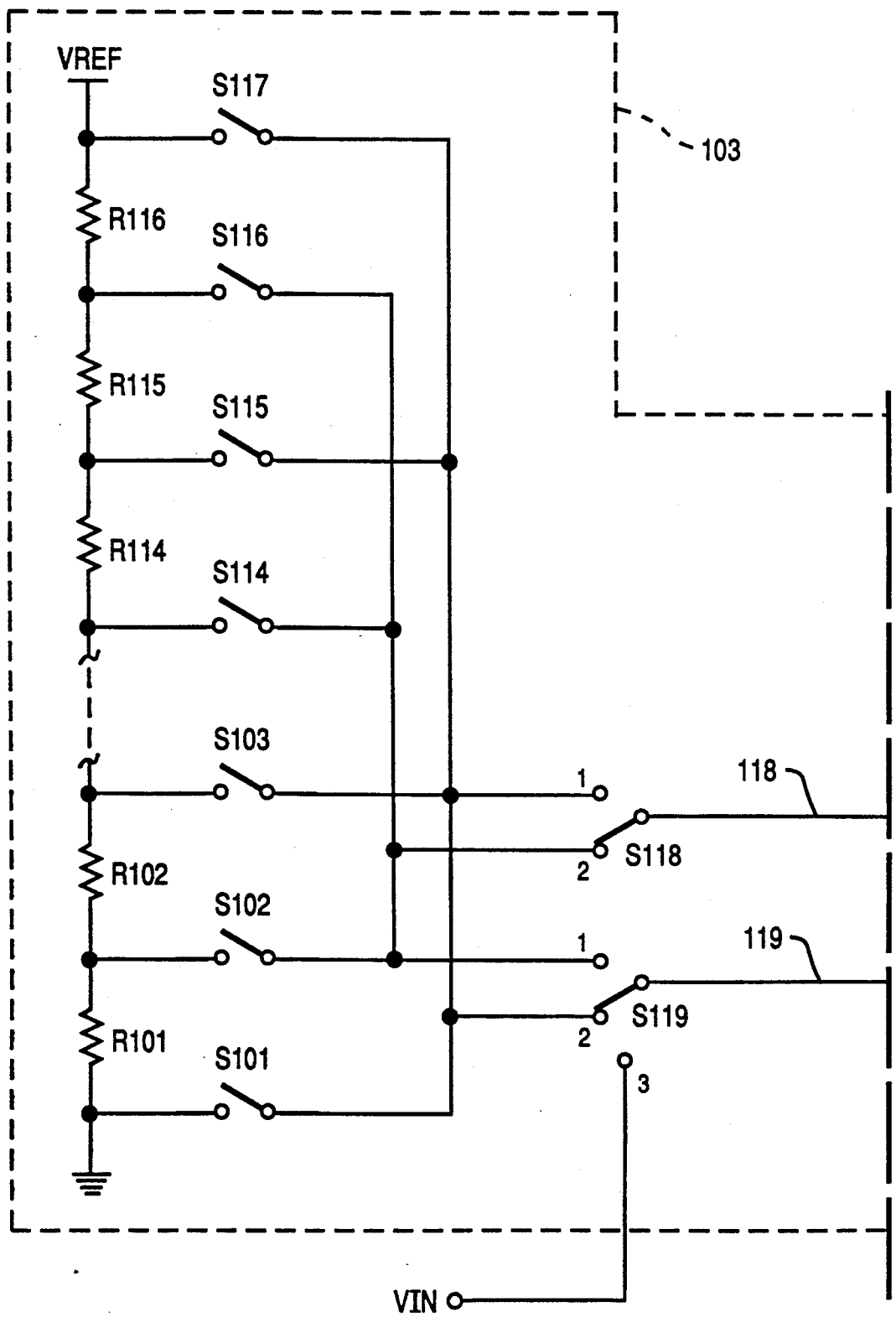
FIGS. 1A and 1B are a schematic diagram of a prior art ten-bit successive-approximation analog-to-digital converter.
Figure 1B:
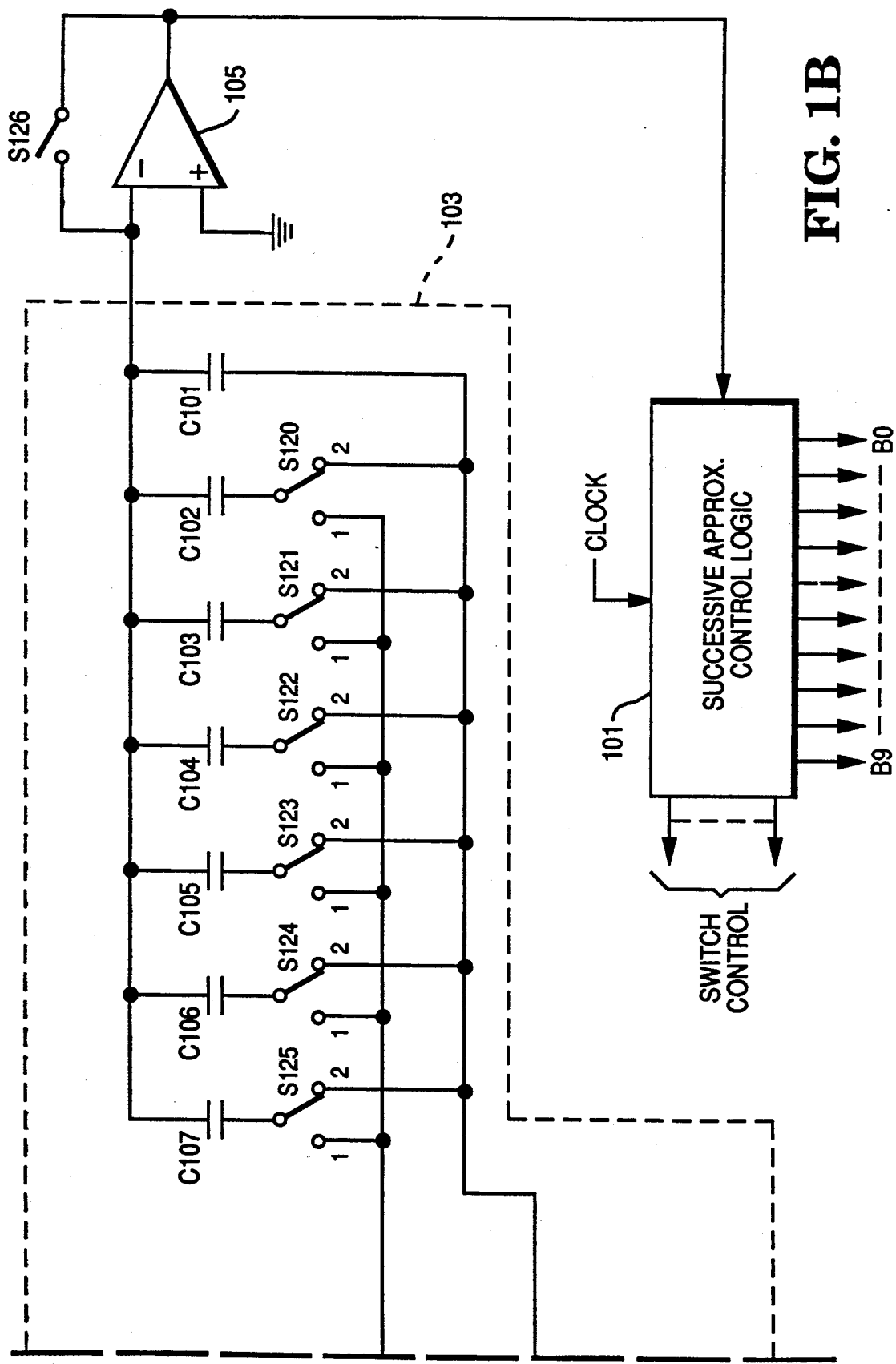

DAC 205 differs in construction from the DAC 103 shown in FIG. 1 by including a tap 305 from the midpoint of resistor string 301. This tap from the node between resistors R308 and R309 provides a voltage, hereinafter referred to as VR1, equal to (VREFP +VREFM)/2. VR1 is provided as one output of the DAC and is also provided to the top plate of capacitor array 303 through switch S320. Another switch, S321 provides the unknown analog voltage VIN to bus B. Switches S320 and S321 are responsive to a signal SMPLB received from the control circuit to provide their input signals to the top plate of capacitor array 303 and bus B, respectively. A signal CONV, which is generated by comparator 207, is provided to switches S318, S319 and S322 through S327. All of the DAC switches discussed above are implemented as CMOS transmission gates. Switches S318, S319 and S322 through S327 are single-pole-double-throw switches.

The operation of DAC 305 in concert with the control logic is as follows. During an initial sample period, the CONV signal is set low positioning switches S322 through S327 to connect the bottom plates of the capacitor array to bus B and opening switches S318 and S319 completely to disconnect buses X and Y from buses A and B. The sample signal SMPLB is also set low closing switches S320 and S321 to provide the unknown analog voltage VIN to bus B and reference voltage VR1 to the top plate of the capacitor array. The capacitor array is thereafter charged to store a voltage equal to VR1−VIN. The sample period ends with signal SMPLB being set HIGH openning switches S320 and S321 to isolate the capacitor array from voltage signals VR1 and VIN. After auto-zeroing of the analog comparator, which will be discussed below, a successive-approximation search is conducted until the voltage potential of the top plate of capacitor array 303 is equal to VR1. The operation of control logic circuit 203 in concert with DAC 205 to convert ten-bit binary data into analog data through successive approximation is well known by those skilled in the art and will not be discussed in greater detail herein.

During the sample period the capacitor array is charged to VR1−VIN. The control logic begins the successive approximation sequence by setting the bottom plates of capacitors C1 through C7 at a voltage equal to VR1, i.e., the voltage at the midpoint of the resistor string. The voltage potential of the top plate of the capacitor array will therefore equal $(2 \times VR1) - VIN$ during the onset of the successive approximation sequence. If the potential of VIN is restricted to be between VREFM and VREFP then the voltage swing on the top plate of the capacitor array is VREFP to VREFM, the supply voltage range for resistor string 301.

Figure 4A:
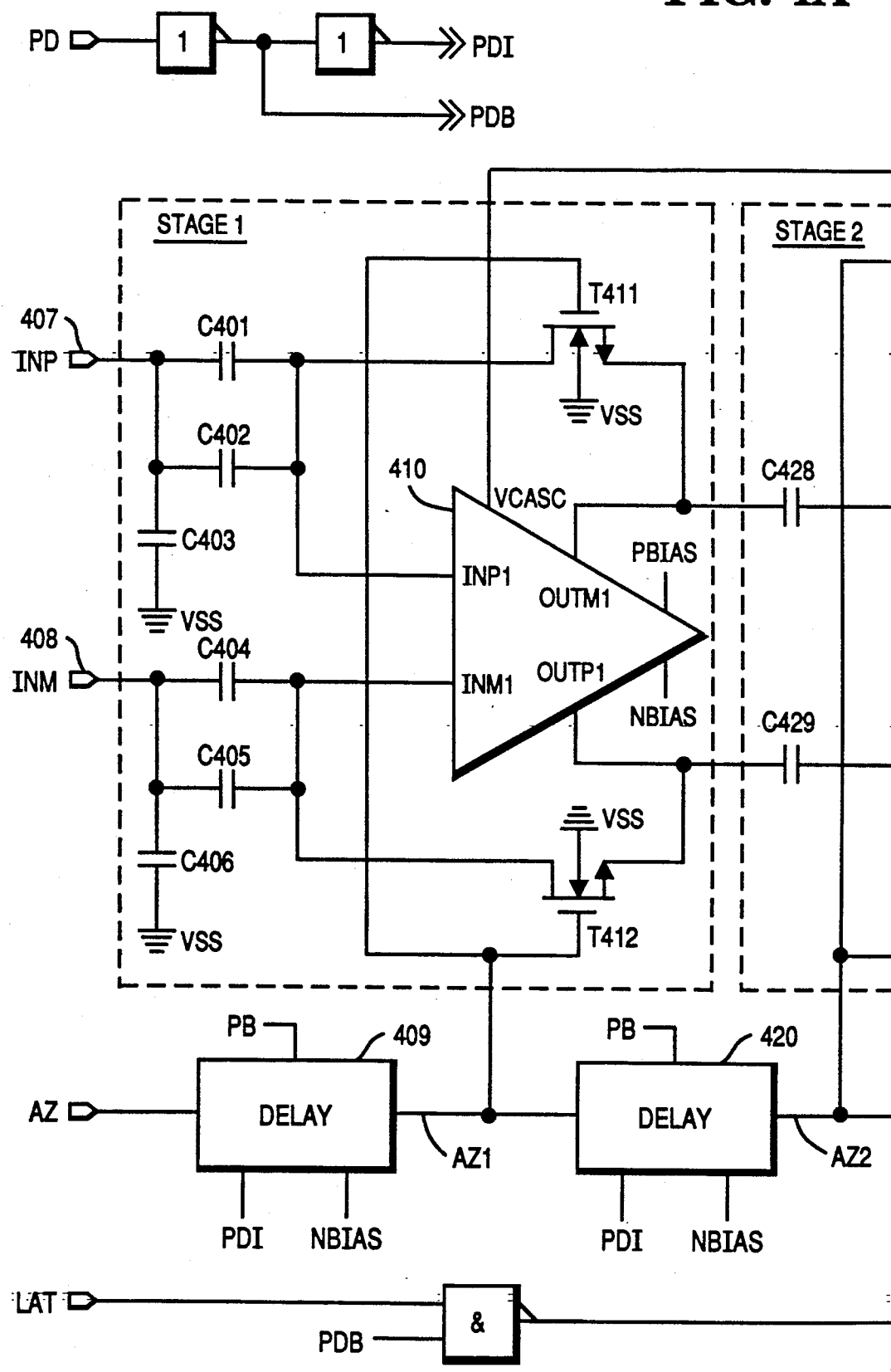
FIGS. 4A and 4B are a schematic diagram of the analog comparator shown in FIG. 2.
Figure 4B:
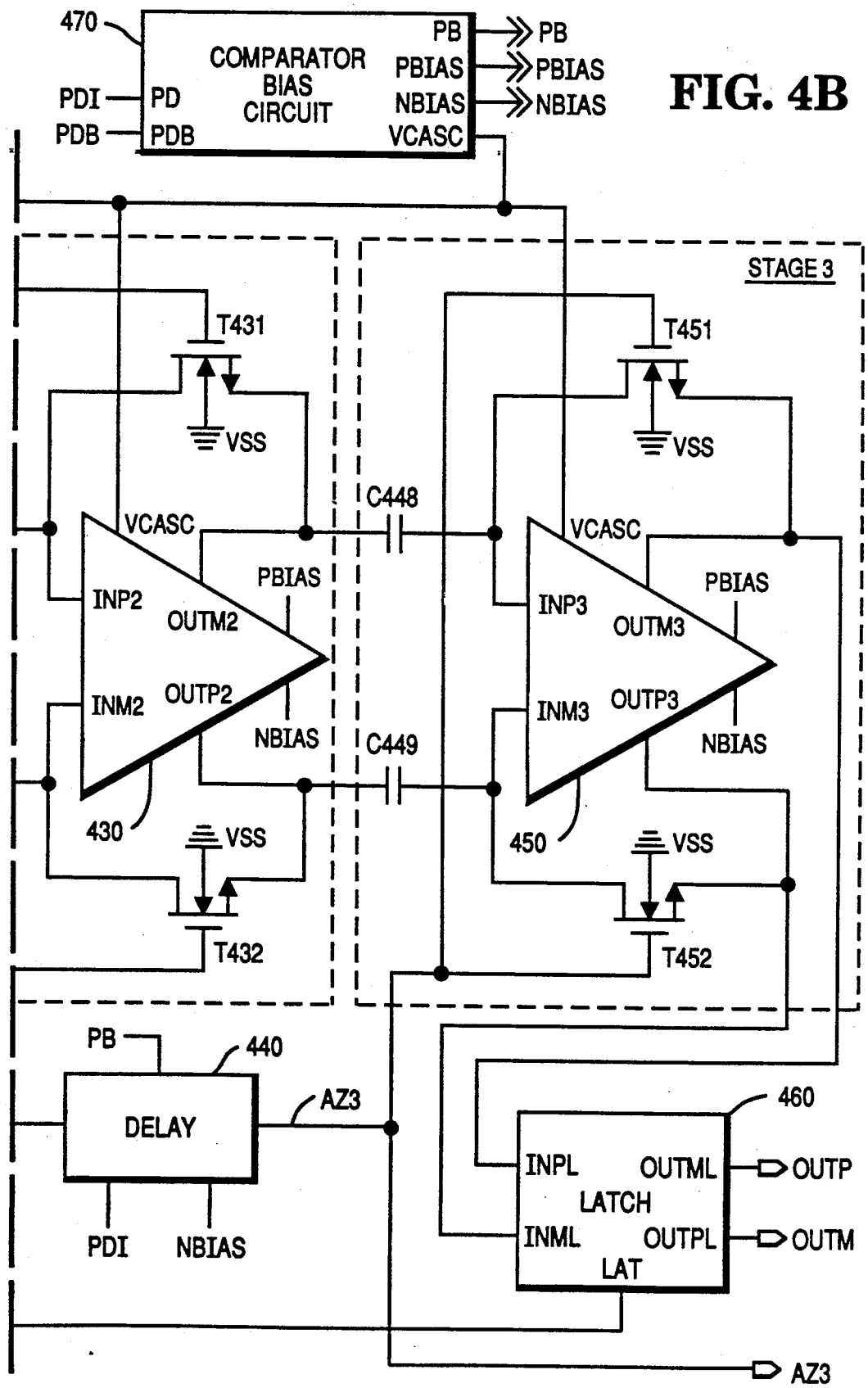

A schematic diagram of analog comparator 205 of FIG. 2 is shown in FIGS. 4A and 4B. Three fully differential amplifier stages with feedback switches and input capacitors are shown. The first stage is connected to the comparator plus and minus inputs, INP and INM. Input INP is provided through parallel-connected input capacitors C401 and C402 to the plus input of a differential amplifier 410. Similarly, input INM is provided through parallel-connected input capacitors C404 and C405 to the minus input of differential amplifier 410. Inputs INP and INM are also connected to voltage source VSS through capacitors C403 and C406, respectively, which represent the parasitic component of the parallel-connected input capacitors. Stage 1 also includes a feedback switch T411 connected between the minus output and plus input of amplifier 410 and a switch T412 connected between the plus output and minus input of the first stage amplifier. Both switches operate in response to a signal AZ1 generated by a delay circuit 409.

Stages 2 and 3 are constructed similarly to stage 1. Stage 2 includes a differential amplifier 430 having a plus input connected to receive the minus output of amplifier 410 through a coupling capacitor C428 and a minus input connected to receive the plus output of amplifier 410 through a coupling capacitor C429. Switches T431 and T432 are provided between the minus output and plus input and the plus output and minus input, respectively, of amplifier 430. Switches T431 and T432 operate in response to a signal AZ2 generated by delay circuit 420.

Stage 3 includes a differential amplifier 450 having a plus input connected to receive the minus output of the second stage amplifier through a coupling capacitor C448 and a minus input connected to receive the plus output of amplifier 430 through a coupling capacitor C449. Switches T451 and T452 are provided between the minus output and plus input and the plus output and minus input, respectively, of amplifier 430. Switches T451 and T452 are controlled by a signal AZ2 generated by delay circuit 440. The third stage is followed by a differential latch 460.

In the preferred embodiment of the invention capacitors C401, C403, C404 and C406 are 0.63 pF capacitors and capacitors C402 and C405 are 0.37 pF capacitors. Capacitors C401 through C406 are poly/metal 1/metal 2 sandwich capacitors to reduce leakage current. Interstage coupling capacitors C428, C429, C448 and C449 are poly/diffussion type capacitors, each having a capacitance of 0.57 pF.

Each comparator stage has a gain of about ten and generates an output signal which is proportional to the difference between the two input signals. The overall gain of the comparator (to the latch input) is about eight hundred as some attenuation occurs through interstage coupling. Transistor switches T411, T412, T431, T432, T451 and T452 are used to configure each comparator stage in a unity gain configuration during auto-zero mode.

Latch 460 is connected to receive as inputs the plus and minus outputs of differential amplifier 450 and functions to save the higher magnitude input signal at a HIGH logic level and the lower magnitude input signal at a LOW logic level.

Delay circuit 409 is connected to receive the inverse of the signal SMPLB generated by the control logic. This inverted signal is designated AZ in FIG. 4. The output of delay circuit 409, signal AZ1 is provided as the input to delay circuit 420 and the output of circuit 420, signal AZ2, is provided as the input of delay circuit 440. Output signal AZ3 is provided through inverter 227 shown in FIG. 2 to control logic 203 and DAC 205. The inverted AZ3 signal is designated as signal CONV in the drawings.

Auto-zeroing of the comparator to eliminate charge injection error which could occur during the ADC sample period is accomplished as follows. Upon conclusion of the sample period the SMPLB signal is set HIGH opening switches S320 and S321 (shown in FIG. 3) and temporarily "floating" the B bus, to which the bottom plate of the capacitor array is connected. Transistor switches T411, T412, T431, T432, T451 and T452 are all in their closed position at this time. Any charge injection is now absorbed by the comparator first stage coupling capacitors C401 through C406. When the SMPLB signal is set HIGH, the input to delay circuit 409, signal AZ, goes LOW. About sixty nanoseconds later signal AZ1 goes low opening switches T411 and T412 and removing the first stage from auto-zero mode. Any differential offsets introduced by the switching of transistors T411 and T412 are amplified by amplifier 410 and absorbed by interstage coupling capacitors C428 and C429. After the passage of another sixty nanoseconds signal AZ2 goes low opening switches T431 and T432 and removing the second stage from auto-zero mode. The above sequence is then repeated for stage three. Any offset introduced by the final stage is insignificant since its effect is divided by the gain of the first two stages. When signal AZ3 is set LOW, signal CONV goes HIGH initiating the successive approximation search.

Figure 5:
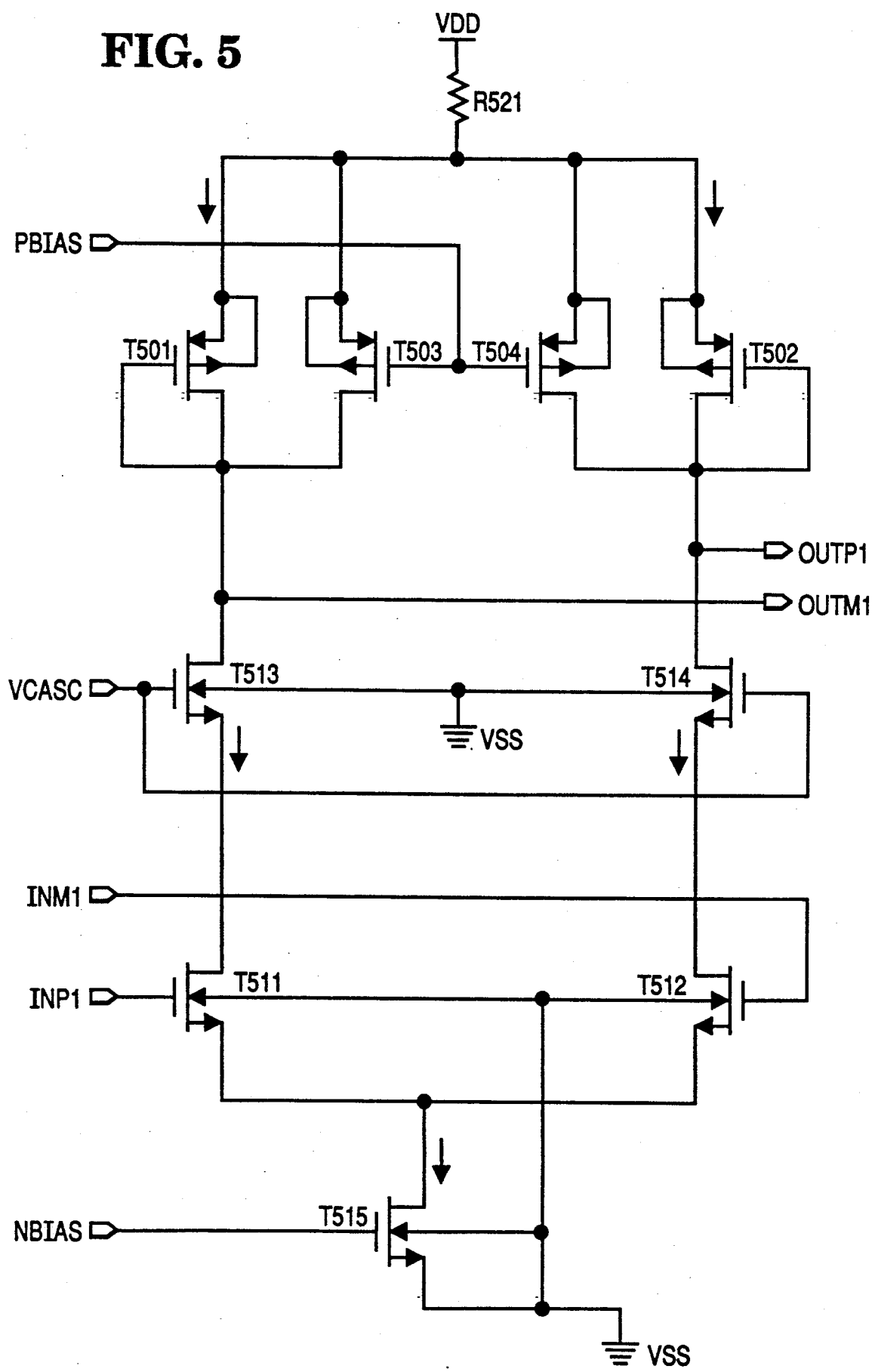
FIG. 5 is a schematic diagram of the differential amplifiers shown in FIG. 4.

A schematic diagram of differential amplifier 410 is provided as FIG. 5. The amplifier consists of NMOS transistors T511, T512 and T515, cascode devices T513 and T514, load devices T501 and T502; and current source devices T503 and T504. Cascode devices T513 and T514 are NMOS transistors, load devices T501 and T502 are diode-connected PMOS transistors, and current source devices T503 and T504 are PMOS transistors. The differential amplifier is similar in construction to the device shown in FIG. 7 of the reference authored by Joey Doernberg et al., referenced above. However, a resistor R521 is added to permit the amplifier voltage to be adjusted to VDD/2 by varying the bias current generated by transistor T515. The presence of resistor R521 does not effect the dynamic performance of the amplifier since the current flow through the resistor is always constant. Amplifiers 430 and 450 are identical in construction and operation to amplifier 410 shown in FIG. 5.

Figure 6B:
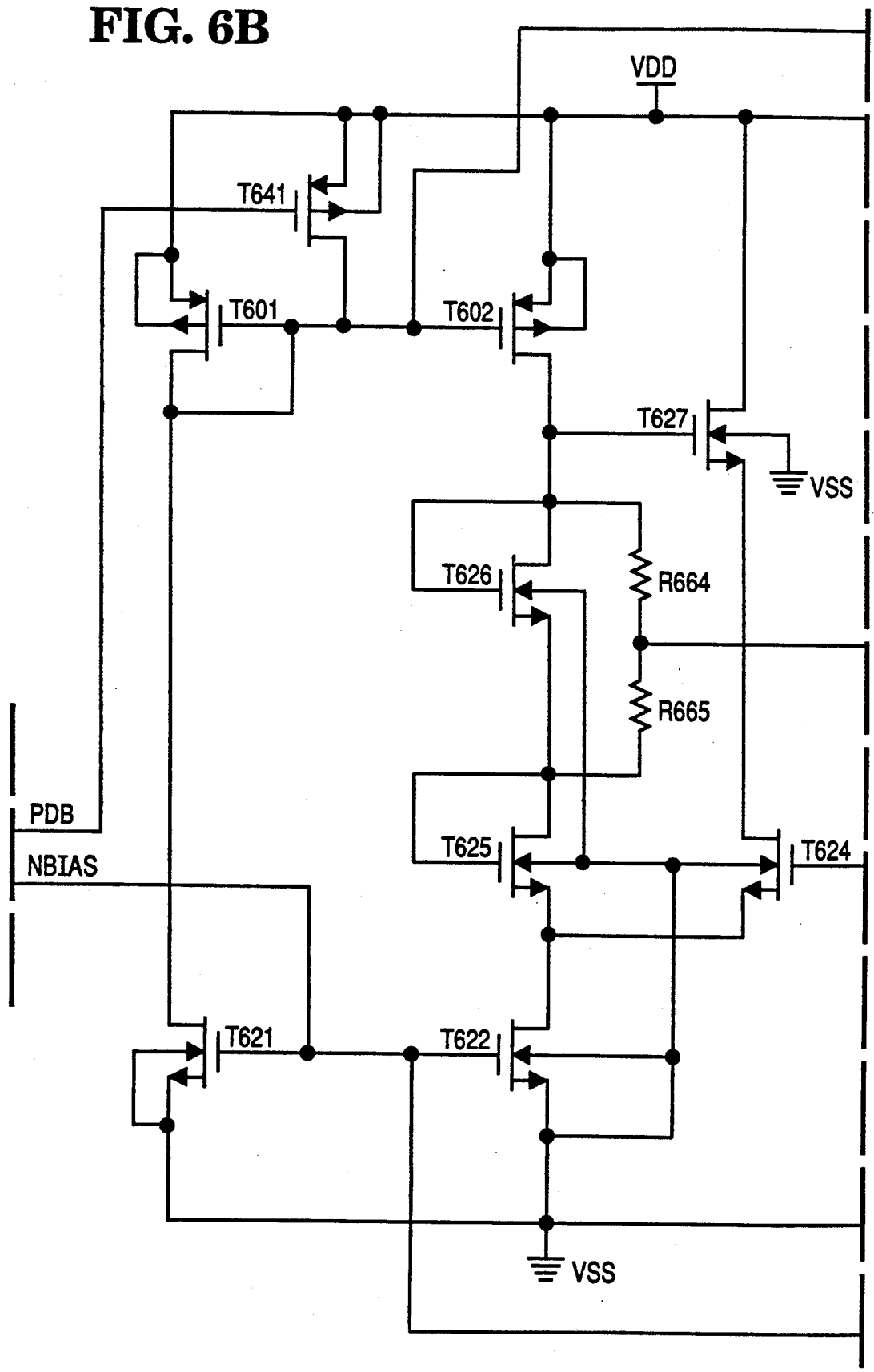
Figure 6C:
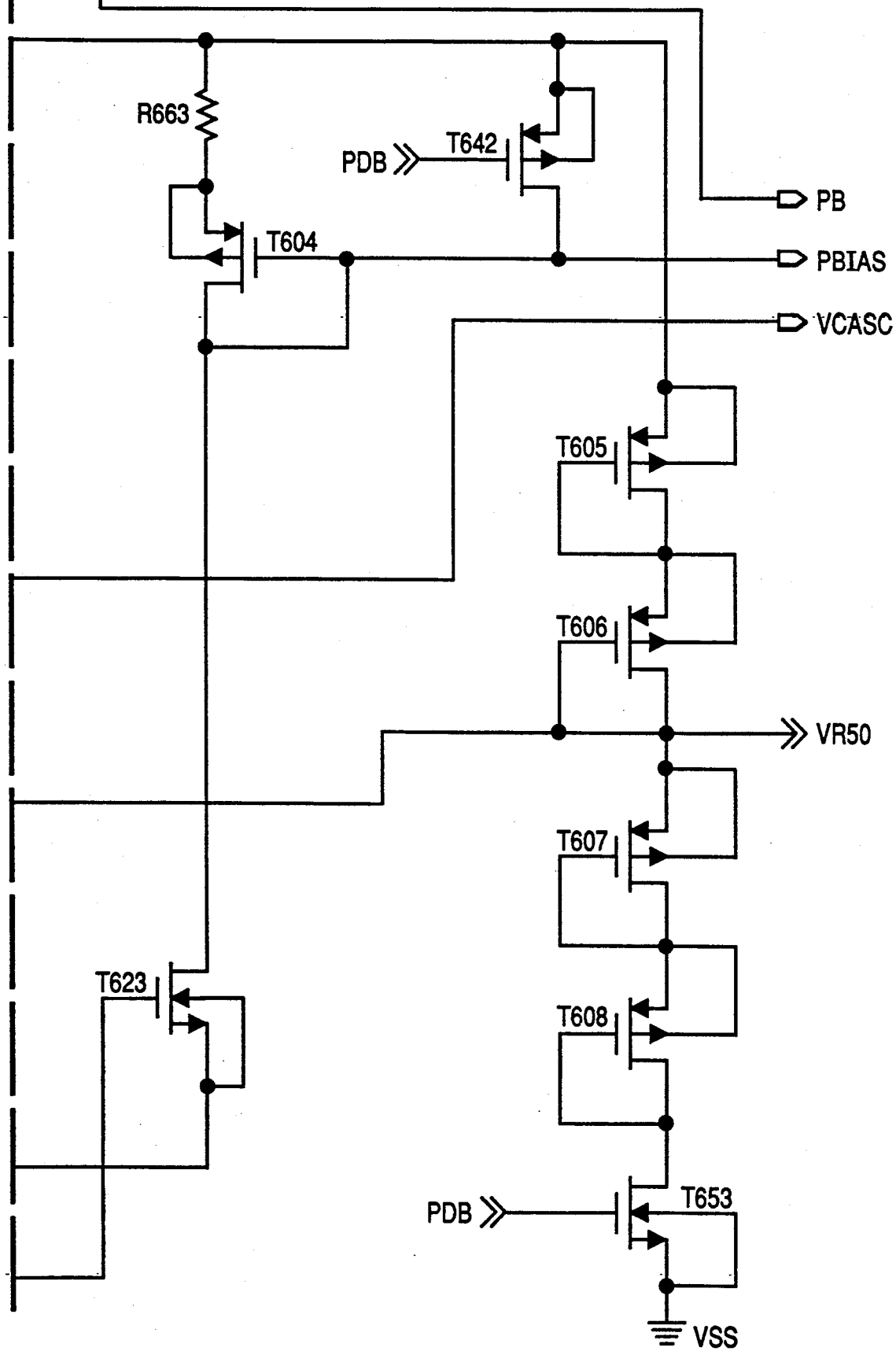

FIGS. 6A through 6C are a schematic diagram of the comparator bias circuit 470 shown in FIG. 4. Referring to FIG. 6A, the circuit includes transistors T609 through T613, T628 and T629 configured to form a simple operational amplifier. The negative, or inverting, input to this opamp is connected to receive signal VR50 from a tap to the midpoint of a PMOS voltage divider consisting of four PMOS transistors, labeled T605 through T608, connected in series between voltage sources VDD and VSS. The positive, or non-inverting input to the opamp is connected to output OUTM4 of a differential amplifier 661, similar to the amplifier shown in FIG. 5, hard-wired in auto-zero mode, i.e. with outputs OUTM4 and OUTP4 connected to inputs INP4 and INM4, respectively. The output of the opamp, signal NBIAS, is provided through a capacitor C662 to input INM4. The opamp and differential amplifier 661 operate to establish a value for NBIAS necessary to force amplifier output OUTM4 to have a voltage of VDD/2.

Circuitry for generating signals PBIAS, PB, VCASC and VR50 is shown in FIGS. 6B and 6C. Bias signal PBIAS is generated by a diode-connected PMOS transistor T601 having its source connected to supply voltage VDD and its drain connected to the drain of an NMOS transistor T621. The source of transistor T621 is connected to supply voltage VSS and its gate is connected to receive bias signal NBIAS. Signal PB, which is used to bias the delay cells (shown as elements 409, 420 and 440 in FIG. 4), is provided at the gate/drain of transistor T601.

PBIAS is generated by a resistor R663, diode connected PMOS transistor T604 and NMOS transistor T623 connected in series between supply voltages VDD and VSS. Resistor R663 is connected between supply voltage VDD and the source of transistor T604. Transistor T623 has its drain connected to the drain of transistor T604, its source connected to supply voltage VSS and its gate connected to receive signal NBIAS. Signal PBIAS is provided at the gate/drain of transistor T604.

VCASC is generated by circuitry including a PMOS transistor T602 having its source connected to supply voltage VDD and its gate connected to receive signal PB; a diode-connected NMOS transistor T626 having its drain connected to the drain of transistor T602; a diode-connected transistor T625 having its drain connected to the source of transistor T626; an NMOS transistor T622 having its drain connected to the source of transistor T625, its source connected to supply voltage VSS and its gate connected to receive signal NBIAS; an NMOS transistor T627 having its drain connected to supply voltage VDD and its gate connected to the drain of transistor T602; and an NMOS transistor T624 having its drain connected to the source of transistor T627, its gate connected to receive signal VR50, and its source connected to the drain of transistor T622. A pair of resistors R664 and R665 are connected in series between the source and drain of transistor T626. Signal VCASC is provided at the node between resistors R664 and R665. The current in the differential transistor pair T624 and T625 is forced in balance by transistor T602, which generates a current equal to one-half of the current in transistor T622. This causes the voltage at the source of transistor T626 to be equal to VR50 and VCASC to be equal to VR50 plus on-half the voltage across transistor T626. This voltage level results in approximately equal drain-to-source voltages on transistors T621/T623 and T622/T624. Transistor T627 is used to force the drain voltages of transistor T624 and T625 to be approximately equal.

Transistors T641, T642, T651, T652 and T653 are responsive to power down signals PD and PDB (which is the inverse of signal PD) to shut down operation of the bias circuit.

The bias circuit, described above, auto zeros the DC voltage of each comparator stage to VDD/2. During the ADC sample period the comparator stage one input capacitors are charged to VR1−VDD/2. At the initiation of the successive approximation sequence the voltage at the plus input to the first stage differential amplifier (element 410 of FIG. 4A) will be VR1−VIN+VDD/2 and the voltage at the minus input will be VR1−VDD/2, where VR1=(VREFP+VREFM)/2 and VIN can be any voltage between and including VREFM and VREFP. Therefore, reference voltages VREFP and VREFM can be set to define any voltage range within or equivalent to the range defined by comparator supply voltages VDD and VSS and all of the comparator internal nodes will remain within the supply voltage rails.

Figure 7:
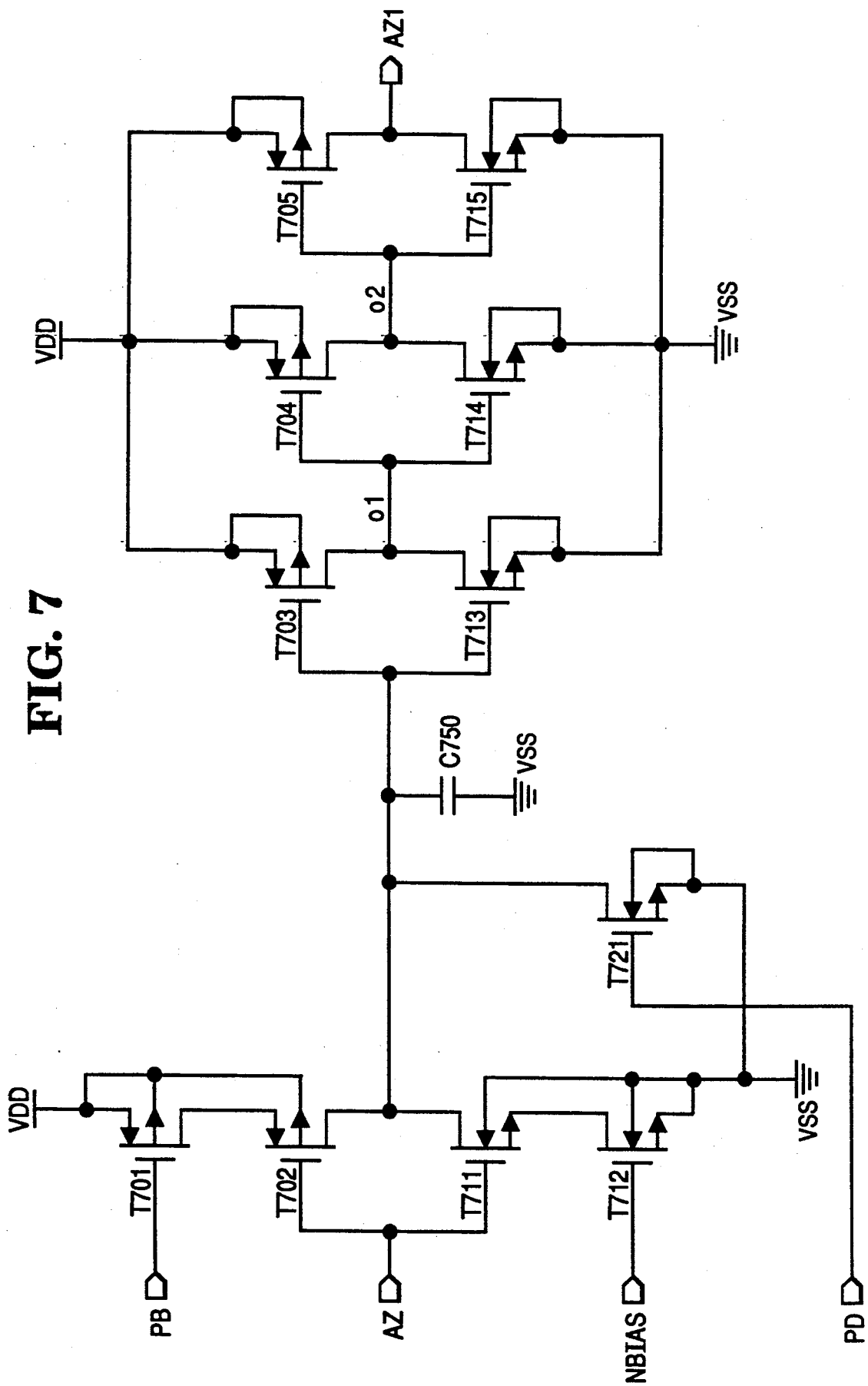
FIG. 7 is a schematic diagram of the delay circuit shown in FIG. 4.

FIG. 7 is a schematic diagram of delay circuit 409 shown in FIG. 4. The delay circuit includes PMOS transistors T701 and T702 and NMOS transistors T711 and T712 connected in series between supply voltages VDD and VSS. Transistor T701 receives bias signal PB at its gate, transistor T712 receives bias signal NBIAS at its gate, and transistors T702 and T711 receive auto-zero signal AZ at their gates. A 0.57 pF capacitor C750 is connected between the node between transistors T702 and T711 and supply voltage VSS. Also connected to this node is the first of three series-connected inverters consisting of transistor pairs T703 and T713, T704 and T714, and T705 and T715, respectively. The output of the delay circuit is provided by the last inverter.

A nominal delay of about 60 nanoseconds is generated by the delay circuit. Transistors T701, T702, T711 and T712 form a switched current source and sink which which charge and discharge capacitor C750. Inverter T703/T713 provides voltage gain while inverters T704/T714 and T705/T715 sharpen the edges of the output transitions of the delay circuit.

Delay circuits 420 and 440 (shown in FIG. 4) are identical in construction to delay circuit 409. Since the comparator gain stages and the delay circuits are biased from a common bias circuit, the auto-zero response time of each comparator stage will track the delay through each delay circuit with respect to supply voltage, process variations and temperature.

It can thus be seen that there has been provided by the present invention an analog-to-digital converter including a novel digital-to-analog converter and comparator implementation which permits the use of rail-to-rail references and input signals. The ADC can achieve higher voltage ranges than prior at ADCs without sacrificing accuracy.

From the foregoing specification it will be clear to those skilled in the art that the present invention is not limited to the specific embodiment described and illustrated and that numerous modifications and changes are possible without departing from the scope of the present invention. For example, the analog-to-digital converter as described above uses a successive approximation search technique to generate known analog voltages for comparison with the unknown analog voltage to be converted to digital format. The invention could employ other search techniques, such as a sequential search, instead of the successive approximation search. In addition, the system as described genarates a reference voltage, identified as VR1, which is equal to (VREFP+VREFM)/2. Although it is believed that (VREFP+VREFM)/2 is the optimum value for VR1, VR1 can be made equal to other voltage potentials within the range defined by VREFP and VREFMI.

These and other variations, changes, substitutions and equivalents will be readily apparent to those skilled in the art without departing from the spirit and scope of the present invention. Accordingly, it is intended that the invention to be secured by Letters Patent be limited only by the scope of the appended claims.

What is claimed is:

1. An analog-to-digital converter for converting an unknown analog voltage to a binary signal, said unknown analog voltage being within a voltage range defined by a first and second reference voltage, said analog-to-digital converted comprising:
   means for generating a known analog voltage;
   means for generating a third reference voltage equal to one-half the sum of said first and second reference voltages;
   means connected to receive said unknown analog voltage and said third reference voltage for subtracting said unknown analog voltage from said third reference voltage and generating an output corresponding thereto;
   means connected to receive said known analog voltage and the output of said subtracting means for summing said known analog voltage with the output of said subtracting means and generating an output corresponding thereto; and means connected to receive the output of said summing means and said third reference voltage for comparing the output of said summing means with said third reference voltage.

2. The analog-to-digital converter according to claim 1, wherein said means for generating a known analog voltage comprises means for generating a known binary signal; and a digital-to-analog converter connected to receive said known binary signal for converting said known binary signal to said known analog signal.

3. The analog-to-digital converter according to claim 2, wherein:

said digital-to-analog converter includes a resistor string having a first end connected to receive said first reference voltage and a second end connected to receive said second reference voltage; and said means for generating said third reference voltage comprises a tap connected to said resistor string at a point midway between said first and second ends.

4. The analog-to-digital converter according to claim 1, wherein said means for comparing comprises an analog comparator.

5. The analog-to-digital converter according to claim 4, wherein said analog comparator receives first and second supply voltages;

said analog comparator includes means for determining the means voltage between said first and second supply voltages; and said analog comparator includes means for auto-zeroing the DC voltage of said comparator to said means voltage.

6. The analog-to-digital converter according to claim 5, wherein said first and second supply voltages define a voltage range which includes said first and second reference voltages.

7. An analog-to-digital converter for converting an unknown analog voltage to a binary signal, comprising:

a digital-to-analog converter for converting a known binary signal including a most significant portion and a least significant portion into a known analog voltage, said digital-to-analog converter including a resistor string connected between first and second reference voltages for converting the most significant portion of said known binary signal and a weighted-capacitor array for converting the least significant portion of said known binary signal;

a tap connected to said resistor string at a point midway between said first and second reference voltages for providing a third reference voltage equal to the mean voltage between said first and second reference voltages;

means for pre-charging said capacitor array to a voltage level equal to said third reference voltage minus said unknown analog voltage whereby said digital-to-analog converter generates an output which equals said known analog voltage plus said third reference voltage minus said unknown analog voltage; and an analog comparator connected to receive the output of said digital-to-analog converter and said third reference voltage for comparing said digital-to-analog converter output to said third reference voltage and generating an output in response thereto.

8. The analog-to-digital converter according to claim 7, further comprising a successive approximation control circuit for generating said known binary signal and connected to provide said known binary signal to said digital-to-analog converter, said control circuit being connected to receive the output of said comparator and responsive thereto to modify said known binary signal.

9. The analog-to-digital converter according to claim 8, wherein said analog comparator receives first and second supply voltages;

said analog comparator includes means for determining the mean voltage between said first and second supply voltages; and said analog comparator includes means for auto-zeroing the DC voltage of said comparator to a voltage equal to said means voltage.

10. The analog-to-digital converter according to claim 9, wherein said first and second supply voltages define a voltage range which includes said first and second reference voltages.

11. An analog-to-digital converter for converting an unknown analog voltage to a binary signal, said unknown analog voltage being within a voltage range defined by a first and second reference voltage, said analog-to-digital converter comprising:

means for generating a known analog voltage;

means for generating a third reference voltage having a value within the voltage range defined by said first and second reference voltages;

means connected to receive said unknown analog voltage and said third reference voltage for subtracting said unknown analog voltage from said third reference voltage and generating an output corresponding thereto;

means connected to receive said known analog voltage and the output of said subtracting means for summing said known analog voltage with the output of said subtracting means and generating an output corresponding thereto; and means connected to receive the output of said summing means and said third reference voltage for comparing the output of said summing means with said third reference voltage.

12. A method for converting an unknown analog voltage having a voltage within a voltage range defined by a first and second supply voltage to a binary signal, the steps comprising:

(a) generating a reference voltage having a value within the voltage range defined by said first and second supply voltages;

(b) generating a known analog voltage;

(c) subtracting said unknown analog voltage from said reference voltage and generating an output corresponding to the difference between said unknown analog voltage and said reference voltage;

(d) summing said known analog voltage with the output of said subtracting step and generating an output corresponding to the sum of said known analog voltage and the output of said subtracting step; and (e) comparing the output of said summing step with said reference voltage.

13. The method recited in claim 12, wherein said reference voltage has a value equal to the mean voltage between said first and second supply voltages.

14. The method recited in claim 13, further comprising the steps of:

(f) generating a new value for said known analog voltage if the difference between the output of said summing step and said reference voltage exceeds a predetermined value; and (g) repeating steps (c) through (f) until the difference between the output of said summing step and said reference voltage no longer exceeds said predetermined value.

* * * * *

UNITED STATES PATENT AND TRADEMARK OFFICE
CERTIFICATE OF CORRECTION

PATENT NO. : 5,016,014
DATED : May 14, 1991
INVENTOR(S) : Ricky F. Bitting

It is certified that error appears in the above-identified patent and that said Letters Patent is hereby corrected as shown below:

Column 10, line 56, "converted" should be --converter--.

Column 11, line 31, "means" should be --mean--.

Column 11, line 35, "means" should be --mean--.

Column 12, line 17, "means" should be --mean--.

Signed and Sealed this

Tenth Day of November, 1992

Attest:

DOUGLAS B. COMER

Attesting Officer

Acting Commissioner of Patents and Trademarks